United States Patent
Li et al.

(10) Patent No.: US 11,655,399 B2
(45) Date of Patent: May 23, 2023

(54) ADHESIVE FILM, PREPARATION METHOD THEREOF, DISPLAY DEVICE AND METHOD FOR REMOVING ADHESIVE FILM

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Ming Li, Beijing (CN); Kaimin Wang, Beijing (CN); Jie Xiang, Beijing (CN); Wei Li, Beijing (CN); Li Wang, Beijing (CN); Jing Wang, Beijing (CN); Zhiyong Yang, Beijing (CN); Fei Chen, Beijing (CN); Fei Li, Beijing (CN); Shuzhen Yang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 289 days.

(21) Appl. No.: 16/768,033

(22) PCT Filed: Nov. 7, 2019

(86) PCT No.: PCT/CN2019/116214
§ 371 (c)(1),
(2) Date: May 28, 2020

(87) PCT Pub. No.: WO2020/098559
PCT Pub. Date: May 22, 2020

(65) Prior Publication Data
US 2020/0369928 A1 Nov. 26, 2020

(30) Foreign Application Priority Data
Nov. 12, 2018 (CN) .......................... 201811341853.6

(51) Int. Cl.
*C09J 11/08* (2006.01)
*C09J 133/24* (2006.01)
(Continued)

(52) U.S. Cl.
CPC ............. *C09J 11/08* (2013.01); *B32B 43/006* (2013.01); *C08K 5/16* (2013.01); *C08K 5/20* (2013.01);
(Continued)

(58) Field of Classification Search
CPC ............................................... C08K 2201/015
See application file for complete search history.

(56) References Cited

U.S. PATENT DOCUMENTS

2004/0191510 A1 9/2004 Kiuchi et al.
2014/0057379 A1 2/2014 Park et al.
(Continued)

FOREIGN PATENT DOCUMENTS

CN 1609158 A 4/2005
CN 102061049 A 5/2011
(Continued)

OTHER PUBLICATIONS

Machine translation of CN 102061049 A (Year: 2011).*
Office Action for related CN App. No. 201811341853.6 dated Apr. 30, 2020. English translation provided; 20 pages.

*Primary Examiner* — Frank D Ducheneaux
(74) *Attorney, Agent, or Firm* — Procopio, Cory, Hargreaves & Savitch LLP

(57) ABSTRACT

An adhesive film includes an adhesive film body, and a plurality of deformable particles dispersed in the adhesive film body. A volume of each of the plurality of deformable particles is capable of shrinking under a trigger condition.

12 Claims, 11 Drawing Sheets

(51) Int. Cl.
  *C09J 7/40*   (2018.01)
  *C09J 7/30*   (2018.01)
  *C08K 5/20*   (2006.01)
  *C08K 5/16*   (2006.01)
  *C09J 7/10*   (2018.01)
  *B32B 43/00*  (2006.01)

(52) U.S. Cl.
  CPC . *C09J 7/10* (2018.01); *C09J 7/30* (2018.01); *C09J 7/40* (2018.01); *C09J 133/24* (2013.01); *H10K 50/80* (2023.02); *C08K 2201/015* (2013.01); *C09J 2301/208* (2020.08); *C09J 2301/408* (2020.08); *C09J 2301/412* (2020.08); *C09J 2433/00* (2013.01); *C09J 2463/00* (2013.01); *C09J 2479/02* (2013.01)

(56) References Cited

U.S. PATENT DOCUMENTS

2015/0284597 A1  10/2015  Carty
2018/0002493 A1  1/2018  Tranchant et al.
2019/0006624 A1* 1/2019  Yoon .......................... C09J 7/10
2020/0369928 A1  11/2020  Li et al.

FOREIGN PATENT DOCUMENTS

| | | |
|---|---|---|
| CN | 102796267 A | 11/2012 |
| CN | 202936363 U | 5/2013 |
| CN | 103631093 A | 3/2014 |
| CN | 104031571 A | 9/2014 |
| CN | 104870567 A | 8/2015 |
| CN | 206219492 U | 6/2017 |
| CN | 107298768 A | 10/2017 |
| CN | 206538372 U | 10/2017 |
| CN | 108504298 A | 9/2018 |
| CN | 109449080 A | 3/2019 |
| JP | H048782 A | 1/1992 |
| JP | H07188471 A | 7/1995 |
| JP | 2010254789 A | 11/2010 |

\* cited by examiner

ADHESIVE FILM, PREPARATION METHOD THEREOF, DISPLAY DEVICE AND METHOD FOR REMOVING ADHESIVE FILM

CROSS-REFERENCE TO RELATED APPLICATIONS

This application is a national phase entry under 35 USC 371 of International Patent Application No. PCT/CN2019/116214 filed on Nov. 7, 2019. which claims priority to the Chinese Patent Application No. 201811341853.6, filed with the China National Intellectual Property Administration on Nov. 12, 2018, and entitled "ADHESIVE FILM AND PREPARATION METHOD THEREOF, DISPLAY DEVICE AND METHOD FOR REMOVING ADHESIVE FILM", which are incorporated herein by reference in their entirety.

TECHNICAL FIELD

The present disclosure relates to the field of display technologies, and in particular to an adhesive film and a preparation method thereof, a display device and a method for removing an adhesive film.

BACKGROUND

There are multiple processes during the manufacture of display products. Prior to a next process, it is often required to attach an adhesive film to the surface of the semi-finished product obtained in the previous process, so as to use the adhesive film to protect the semi-finished product and/or facilitate the transfer of the semi-finished product. Subsequently, the adhesive film is removed in the next process of the semi-finished product.

SUMMARY

In one aspect, an adhesive film is provided. The adhesive film includes an adhesive film body, and a plurality of deformable particles dispersed in at least a part of the adhesive film body. A volume of each of the plurality of deformable particles is capable of shrinking under a trigger condition.

In some embodiments of the present disclosure, materials of the plurality of deformable particles include temperature-responsive polymers or pH-responsive polymers.

In some embodiments of the present disclosure, the temperature-responsive polymers include at least one of poly (N-isopropylacrylamide) or poly(N,N-vinyl-epsilon-caprolactam).

In some embodiments of the present disclosure, the adhesive film body includes a main adhesive layer, and at least one auxiliary adhesive layer each stacked on one of two sides of the main adhesive layer in a thickness direction of the main adhesive layer. The plurality of deformable particles are dispersed in the auxiliary adhesive layer.

In some embodiments of the present disclosure, the at least one auxiliary adhesive layer includes one auxiliary adhesive layer located on one of the two sides of the main adhesive layer in the thickness direction of the main adhesive layer. The main adhesive layer is configured to be attached to a target object via another of the two sides of the main adhesive layer. In some other embodiments, the at least one auxiliary adhesive layer includes two auxiliary adhesive layer located on the two sides of the main adhesive layer in the thickness direction of the main adhesive layer, respectively.

In some embodiments of the present disclosure, materials of the auxiliary adhesive layer include at least one of polydopamine, acrylic adhesive or epoxy resin adhesive.

In some embodiments of the present disclosure, the adhesive film further includes at least one protective film, each of which is located on one of two sides of the adhesive film body in a thickness direction of the adhesive film body. For example, the at least one protective film includes two protective films located on the two sides of the adhesive film body in the thickness direction of the adhesive film body, respectively.

In another aspect, a method for preparing the adhesive film according to some embodiments described above is provided. The method for preparing the adhesive film includes: providing the adhesive film body; and dispersing the plurality of deformable particles in at least a part of the adhesive film body, the volume of each of the plurality of deformable particles being capable of shrinking under a trigger condition.

In some embodiments of the present disclosure, providing the adhesive film body includes: forming a main adhesive layer. Dispersing the plurality of deformable particles in at least a part of the adhesive film body includes: dispersing the plurality of deformable particles in materials used for forming at least one auxiliary adhesive layer, and coating the obtained materials on at least one of two sides of the main adhesive layer in a thickness direction of the main adhesive layer to form the at least one auxiliary adhesive layer which is located on at least one of the two sides of the main adhesive layer and in which the plurality of deformable particles are dispersed.

In still another aspect, a display device is provided. The display device includes a display product, and the adhesive film according to some embodiments described above attached to the display product.

In some embodiments of the present disclosure, the display product is an organic light-emitting diode (OLED) display panel.

In still another aspect, a method for removing an adhesive film is provided. The method for removing an adhesive film includes: providing a target object and the adhesive film according to some embodiments described above attached to the target object; stimulating the plurality of deformable particles in the adhesive film under the trigger condition, so that the volume of each of the plurality of deformable particles shrinking to curl the adhesive film toward a side away from the target object; and detaching the target object from the adhesive film through a region where the adhesive film is curled.

In some embodiments of the present disclosure, materials of the plurality of deformable particles are temperature-responsive polymers. Stimulating the plurality of deformable particles in the adhesive film under the trigger condition includes: heating the plurality of deformable particles to control a temperature of the plurality of deformable particles to be greater than a lower critical solution temperature of the temperature-responsive polymers.

In some embodiments of the present disclosure, materials of the plurality of deformable particles are pH-responsive polymers. Stimulating the plurality of deformable particles in the adhesive film under the trigger condition includes: changing a pH value of the adhesive film in which the plurality of deformable particles are dispersed.

In some embodiments of the present disclosure, the target product is a display panel.

BRIEF DESCRIPTION OF THE DRAWINGS

To describe the technical solutions in some embodiments of the present disclosure more clearly, drawings to be used in the description of some embodiments will be briefly introduced below. Apparently, the drawings to be described below merely show some embodiments of the present disclosure. For a person of ordinary skill in the art, other drawings may be obtained according to those drawings without paying any creative effort.

DETAILED DESCRIPTION

The technical solutions in some embodiments of the present disclosure will be described clearly and completely with reference to the drawings in some embodiments of the present disclosure. Apparently, the embodiments to be described are merely some but not all of the embodiments of the present disclosure. All other embodiments obtained by a person of ordinary skill in the art without paying any creative effort on the basis of the embodiments in the present disclosure are within the protection scope of the present disclosure.

The terms "first", "second" and "third" are merely for illustrative purpose, and should not be interpreted as indicating or implying the relative importance or implicitly indicating the number of the specified technical features. Therefore, the features defined by the terms "first". "second" and "third" may explicitly or implicitly comprise one or more features. Unless otherwise stated, in the description of some embodiments of the present disclosure, "a plurality of" means two or more.

The word such as "comprise/comprising" or "include/including" used in the specification and claims of the present disclosure means that an element or object before this word encompasses elements, objects or equivalents thereof listed behind this word and does not exclude other elements or objects. The orientation or position relation indicated by terms "upper/above" and "lower/below" or the like is an orientation or position relation shown by the drawings, merely for briefly describing the technical solutions of the present disclosure rather than indicating or implying that the specified device or element must have a particular orientation or be constructed and operated in a particular orientation. Therefore, it should not be interpreted as limitations to the present disclosure.

In addition, since the actual thickness of each film layer and the actual particle size of deformable particles involved in some embodiments of the present disclosure are very small, for clarity, the corresponding size of each structure in all the drawings in some embodiments of the present disclosure may be enlarged. Unless otherwise stated, the thickness of each film layer and the particle size of deformable particles do not represent the actual size and scale.

During the manufacture of display products, a conventional process for removing an adhesive film will be described below. The adhesive film is irradiated by ultraviolet (abbreviated as UV) light, so that the viscosity of the adhesive film is reduced by UV light (i.e., viscosity is reduced by UV); and then, the adhesive film is detached from the related structure, for example, by mechanical removal.

Figure 1:
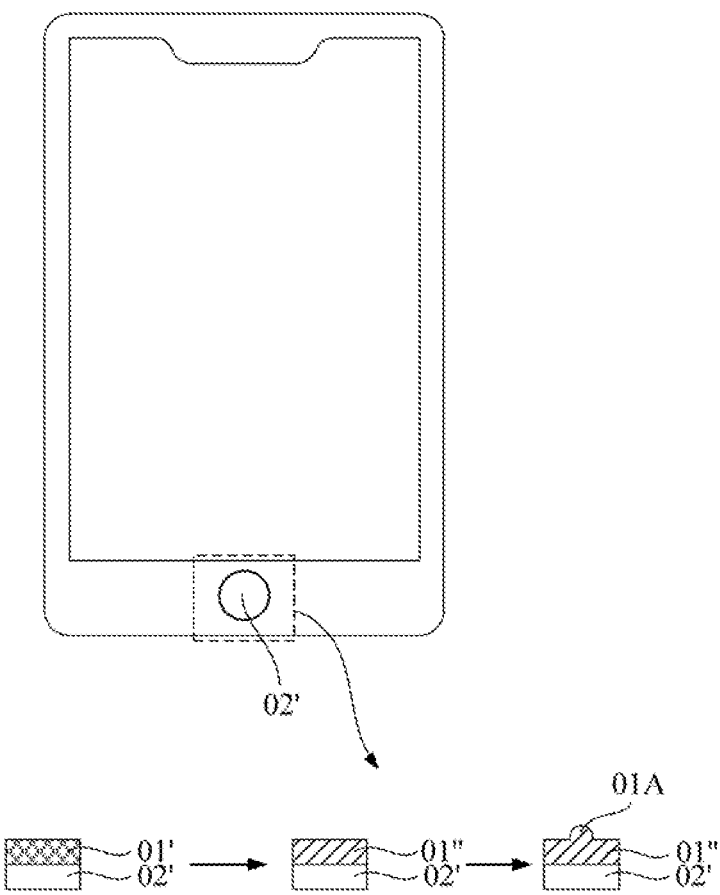
FIG. 1 is a schematic view of removing an adhesive film attached to a local region of a display panel in the related art.

By taking the removal of an adhesive film attached to a local region of the display panel as an example, the process for removing the adhesive film in the related art will be exemplarily described herein. As shown in FIG. 1, an adhesive film is attached to a fingerprint frame (commonly referred to as Home key or Start key) 02' of a terminal product. When it is required to remove the adhesive film 01' attached to the fingerprint frame 02', the adhesive film 01' is irradiated by UV, so that it is transformed into an adhesive film 01" with reduced viscosity. Since the area of the adhesive film 01' is small, after the viscosity of the adhesive film 01' is reduced by UV, there is still no point of application for mechanical tearing on the surface of the adhesive film 01" with reduced viscosity. Thus, it is required to artificially cock (or poke) a raised point, as a handle 01a for mechanical tearing, on the surface of the adhesive film 01" with reduced viscosity by sharp tools such as tweezers. Accordingly, the adhesive film on the surface of the fingerprint frame 02' is removed by mechanical stripping. However, the sharp tool used during the operation process is likely to scratch the surface of the fingerprint frame 02', thereby affecting the performance of the fingerprint frame 02'. Therefore, for a related structure that is small in size or a related structure that has a film attached to a local region thereof, the conventional process for removing the adhesive film is difficult in film removal, has residual adhesive material, or has other problems, thereby affecting the yield of the manufactured products.

Figure 2:
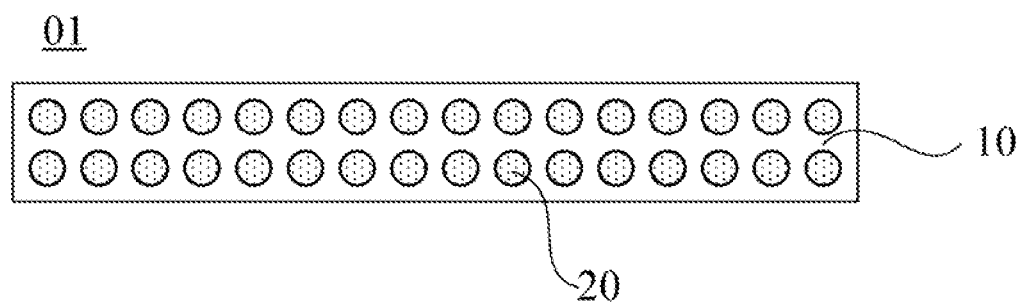
FIG. 2 is a schematic sectional structural view of an adhesive film in its thickness direction, in accordance with some embodiments of the present disclosure.

Some embodiments of the present disclosure provide an adhesive film. As shown in FIG. 2, the adhesive film 01 includes an adhesive film body 10 and a plurality of deformable particles 20 dispersed in the adhesive film body 10. A volume of each of the plurality of deformable particles 20 is capable of shrinking under a trigger condition.

It is to be noted that the adhesive film body 10 is a main part of the adhesive film 01. In some embodiments of the present disclosure, the material of the adhesive film body 10 will not be limited as long as the material is an adhesive material satisfying the corresponding requirements on viscosity.

The deformable particles 20 include, but are not limited to, spherical particles shown in FIG. 2. For example, the deformable particles 20 are prismatic particles or particles in other geometries, such as hexagonal particles. The deformable particles 20 are made of material(s) whose volume can shrink under a trigger condition.

Here, the trigger condition refers to a preset condition under which the deformable particles 20 can be stimulated. That is, the deformable particles 20 are treated by a certain treatment method (e.g., by changing the temperature of the deformable particles 20, changing the pH value of an environment where the deformable particles 20 are located, changing the illumination to the deformable particles 20, etc.). After the deformable particles 20 respond to the corresponding treatment, the structure inside the deformable particles 20 changes and the deformable particles 20 shrink in volume.

Figure 3:
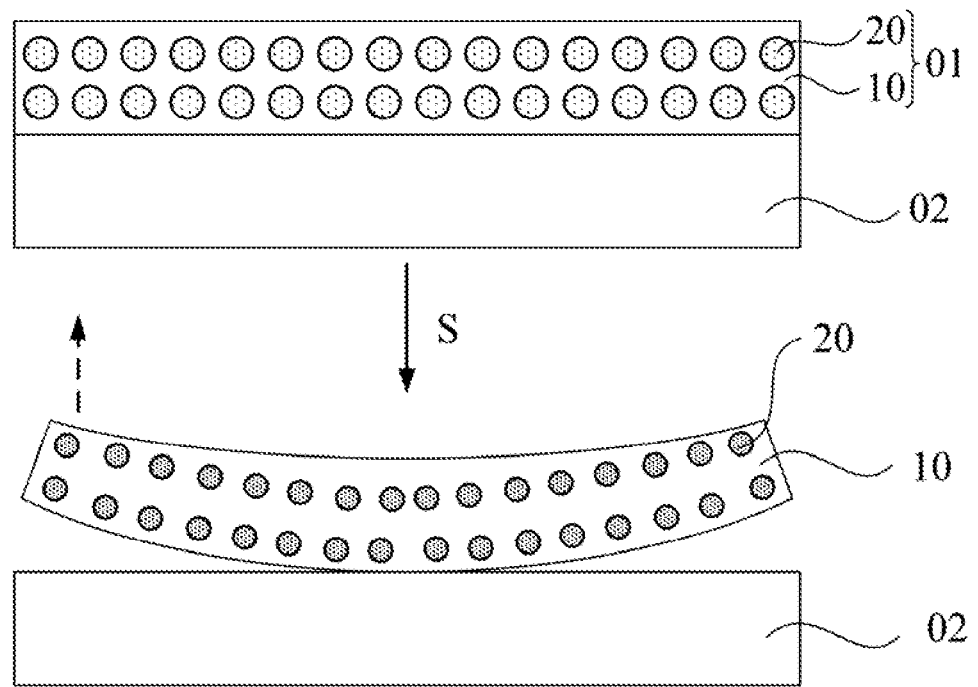
FIG. 3 is a schematic view of removing the adhesive film of FIG. 2.

As shown in FIG. 3, the adhesive film 01 is attached (for example, bonded) to the surface of a target object (e.g., a display panel) 02. The adhesive film body 10 in the adhesive film 01 is made of adhesive material(s) with certain viscosity. A trigger condition S is applied to the adhesive film 01, so that the volume of the deformable particles 20 in the adhesive film body 10 can quickly shrink (i.e., decrease) under the stimulation of the trigger condition S, and molecular chains forming the adhesive material(s) in the adhesive film body 10 are dragged, so that an inward shrinkage stress is generated in the adhesive film body 10. Since the target object 02, to which the adhesive film body 10 is bonded, is hard and difficult to deform, the adhesive film body 10 itself will be curled due to the inward shrinkage stress, so that edges of the adhesive film body 10 (e.g., peripheral edges of the adhesive film body 10) are cocked toward a side away from the target object 02 (upwardly, indicated by the dashed arrow in FIG. 3), thereby forming a point of application (i.e., a mechanical handle) for mechanical tearing. In this way, the adhesive film 01 may be easily torn off from the surface of the target object 02.

In FIG. 3 and the drawings subsequently described in this specification, the "trigger condition" is denoted by the letter "S".

It can be understood that the number and distribution of the deformable particles 20 illustrated in FIG. 2 are merely illustrative, and will not be limited in some embodiments of the present disclosure.

The dispersion ratio of the plurality of deformable particles 20 in the adhesive film body 10 can be adaptively adjusted according to the particle size of the deformable particle 20 (when the deformable particles 20 are spherical particles, the "particle size" refers to the diameter of the sectional circle of the deformable particle 20 taken in the thickness direction of the adhesive film 01; and, when the deformable particles 20 are non-spherical particles, the "particle size" refers to the diameter of the equivalent circle of the sectional shape of the deformable particle 20 taken in the thickness direction of the adhesive film 01) and the thickness of the adhesive film body 10. One possible adjustment method will be described below. When the deformable particles 20 are small in particle size, multiple deformable particles 20 may be dispersed in the adhesive film body 10 in a high volume ratio; and, when the deformable particles 20 are large in particle size, multiple deformable particles 20 may be dispersed in the adhesive film body 10 in a low volume ratio.

In some examples, the dispersion ratio (i.e., volume ratio) of the deformable particles 20 in the adhesive film body 10 is 10% to 30%. Within this ratio range, the adhesive film 01 can be curled more obviously, and the viscosity of the adhesive film body 10 will not be affected. The effect is, for example, that the adhesive film 01 is not curled enough to form a point of application for mechanical tearing, or the adhesive film 01 is low in viscosity, or the like.

In addition, the distribution of the plurality of deformable particles 20 in the adhesive film body 10 includes, but is not limited to, the two-layer even distribution illustrated in FIG. 2. The distribution of the plurality of deformable particles 20 in the adhesive film body 10 may be one-layer distribution or distribution in more than two layers. Moreover, it is also possible that the deformable particles 20 are unevenly distributed, partially evenly distributed or partially unevenly distributed in the adhesive film body 10. The specific distribution of the deformable particles 20 may be flexibly adjusted according to different tearing requirements. The distribution shown in FIG. 2 is merely illustrative.

On this basis, in some embodiment of the present disclosure, a plurality of deformable particles 20 that can quickly shrink after being stimulated under a trigger condition can be added in the adhesive film body 10. Thus, by dragging molecular chains in the adhesive film body 10 through the volume shrinkage of the plurality of deformable particles 20, an inward shrinkage stress can be generated in the adhesive film body 10, so that the edge of the adhesive film 01 is shrunk and curled. Accordingly, after the adhesive film 01 is curled, the adhesive film 01 may be easily detached from the target object 02 originally bonded thereto. Thus, by reducing the removal difficulty of the adhesive film 01, the adhesive film 01 may be more effectively detached from the target object 02 bonded thereto, and the problems such as adhesive material residue may be avoided.

In addition, by using the adhesive film 01 in the above some embodiments, the adhesive film that cannot be removed or is difficultly removed (e.g., the adhesive film attached to the fingerprint frame, the back film (BF) attached to the back of the display panel) by the conventional process for removing the adhesive film in the related art may be removed easily and conveniently.

In some embodiments of the present disclosure, the plurality of deformable particles 20 are distributed in a local region of the adhesive film body 10. Exemplarily, with reference to FIG. 4, the adhesive film body 10 includes a main adhesive layer 11, and an auxiliary adhesive layer 12 stacked on at least one of two sides of the main adhesive layer 11 in a thickness direction of the main adhesive layer 11 (indicated by the dashed double-headed arrow in FIG. 4). The deformable particles 20 are dispersed in the auxiliary adhesive layer, that is, the deformable particles 20 are dispersed in a local region of the adhesive film body 10.

For example, the main adhesive layer 11 is an optically clear adhesive (abbreviated as OCA) layer, which can be used to bond a transparent optical element.

According to the position of the auxiliary adhesive layer 12 in the adhesive film 01, the adhesive film 01 correspondingly has various different structures, as detailed in the following examples.

Figure 4:
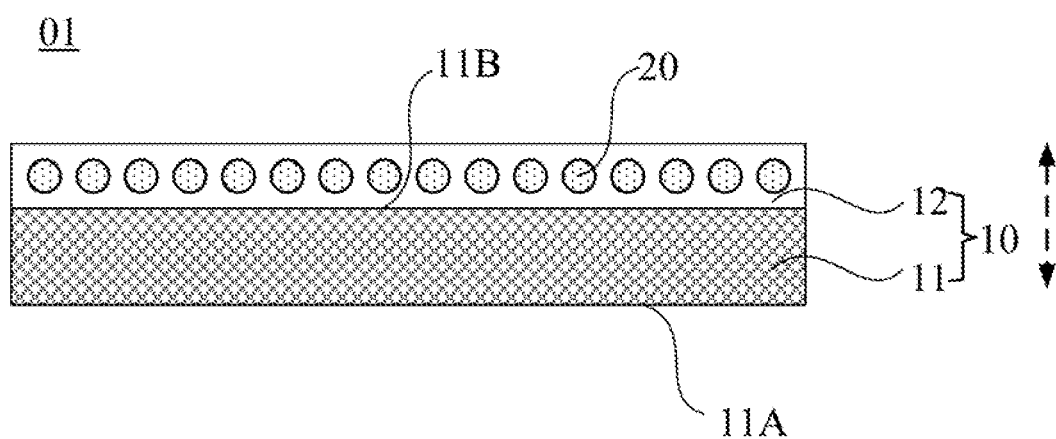
FIG. 4 is a schematic sectional structural view of another adhesive film in its thickness direction, in accordance with some embodiments of the present disclosure.
Figure 5:
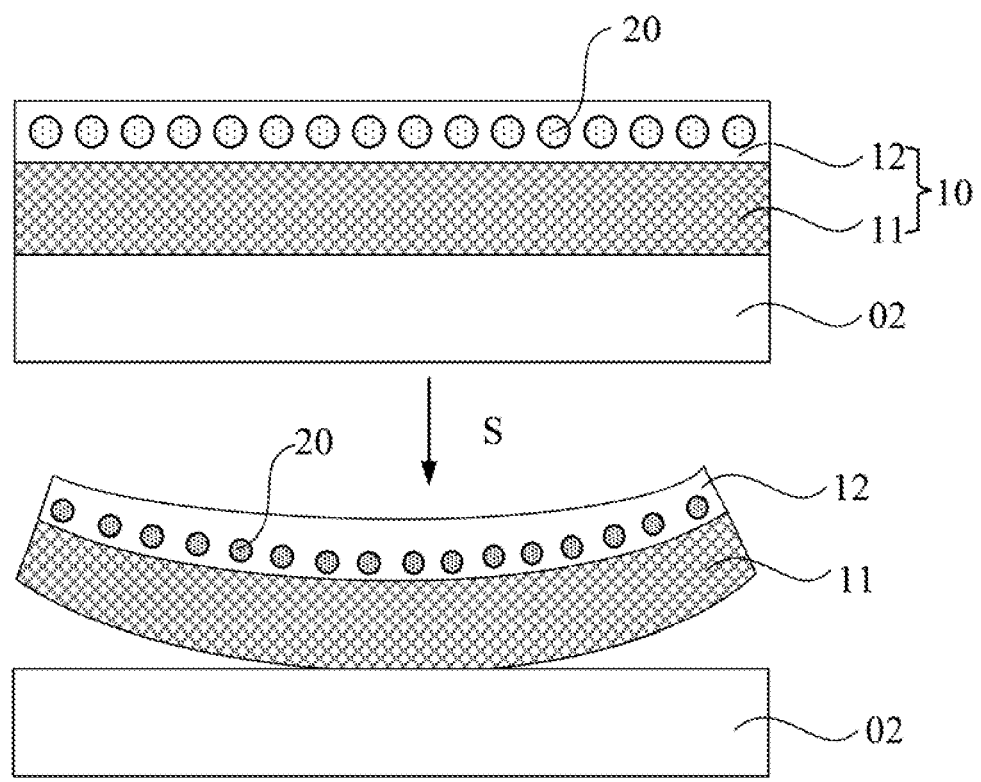
FIG. 5 is a schematic view of removing the adhesive film of FIG. 4.

In some examples, as shown in FIGS. 4 and 5, the adhesive film body 10 includes a main adhesive layer 11 and an auxiliary adhesive layer 12 disposed on a side of the main adhesive layer 11 away from the target object 02. The plurality of deformable particles 20 are dispersed in the auxiliary adhesive layer 12. With continued referring to FIG. 5, after the adhesive film 01 is attached to the surface of the target object 02 (e.g., a display panel), if it is required to remove the adhesive film 01, the plurality of deformable particles 20 in the auxiliary adhesive layer 12 are stimulated under the trigger condition S so that the volume of the deformable particles 20 shrinks quickly, and the auxiliary adhesive layer 12 can be curled thus to curl the main adhesive layer 11 bonded to and located below the auxiliary adhesive layer 12. Accordingly, the adhesive film 01 may be easily detached from the target object 02.

Figure 6:
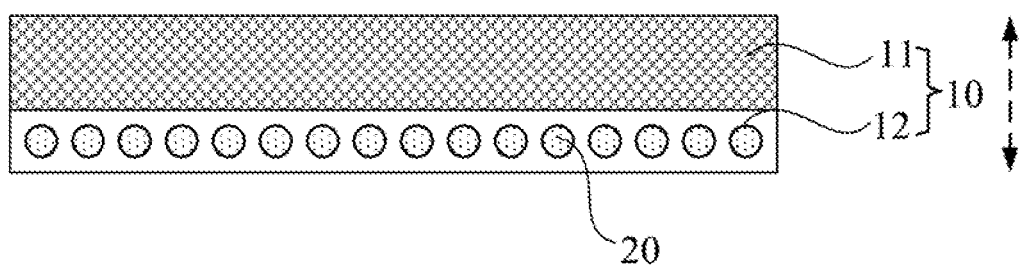
FIG. 6 is a schematic sectional structural view of still another adhesive film in its thickness direction, in accordance with some embodiments of the present disclosure.
Figure 7:
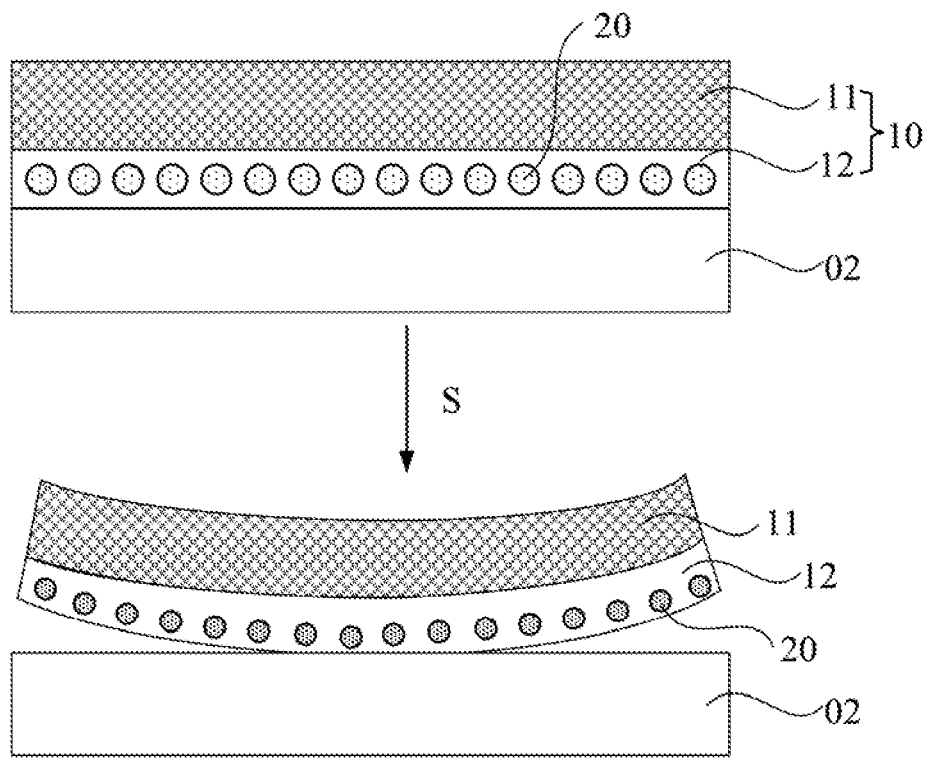
FIG. 7 is a schematic view of removing the adhesive film of FIG. 6.

In some other examples, as shown in FIGS. 6 and 7, the adhesive film body 10 includes a main adhesive layer 11 and an auxiliary adhesive layer 12 disposed on a side of the main adhesive layer 11 proximate to the target object 02. The plurality of deformable particles 20 are dispersed in the auxiliary adhesive layer 12. With continued referring to FIG. 7, after the adhesive film 01 is attached to the surface of the target object 02 (e.g., a display panel), if it is required to remove the adhesive film 01, the plurality of deformable particles 20 in the auxiliary adhesive layer 12 are stimulated under the trigger condition S so that the volume of the deformable particles shrinks quickly, and the auxiliary adhesive layer 12 can be curled thus to curl the main adhesive layer 11 bonded to and located above the auxiliary adhesive layer 12. Accordingly, the adhesive film 01 may be easily detached from the target object 02.

Figure 8:
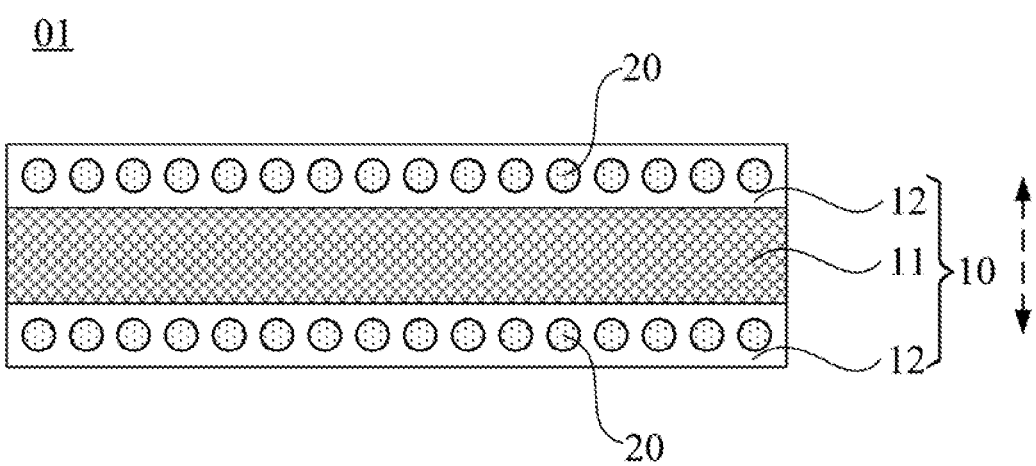
FIG. 8 is a schematic sectional structural view of yet another adhesive film in its thickness direction, in accordance with some embodiments of the present disclosure.
Figure 9:
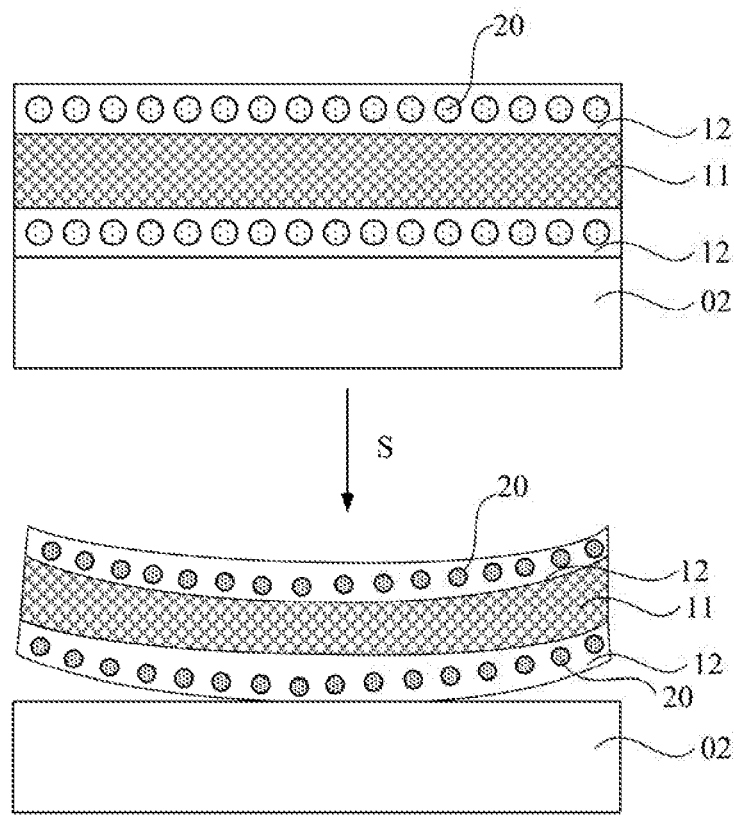
FIG. 9 is a schematic view of removing the adhesive film of FIG. 8.

In still other examples, as shown in FIGS. 8 and 9, the adhesive film body 10 includes a main adhesive layer 11 and auxiliary adhesive layers 12 respectively stacked on two sides of the main adhesive layer 11 in the thickness direction of the main adhesive layer 11 (indicated by the dashed double-headed arrow in FIG. 8). The plurality of deformable particles 20 are dispersed in the two auxiliary adhesive layers 12. With continued referring to FIG. 9, after the adhesive film 01 is attached to the surface of the target object 02 (e.g., a display panel), if it is required to remove the adhesive film 01, the plurality of deformable particles 20 in the two auxiliary adhesive layers 12 are stimulated under the trigger condition S so that the volume of the deformable particles shrinks quickly, and the two auxiliary adhesive layers 12 can be curled thus to curl the main adhesive layer 11 bonded to and located between the two auxiliary adhesive layers 12. Accordingly, the adhesive film 01 may be easily detached from the target object 02.

In the above some embodiments, under the premise of maintaining the viscosity required for the attaching process, the main adhesive layer 11 should be as thin as possible. In this way, it is convenient to curl the main adhesive layer 11 when the auxiliary adhesive layer 12 is curled.

Further, in the structure of the adhesive film 01 illustrated in FIGS. 6 and 8, considering that an auxiliary adhesive layer 12 is provided on a side of the main adhesive layer 11 proximate to the target object 02, when the auxiliary adhesive layer 12 is curled, it is required to lift up and curl the main adhesive layer 11 on top of it. Therefore, the adhesive film 01 shown in FIG. 4 is used in some embodiments of the present disclosure. That is, two surfaces of the main adhesive layer 11 in the adhesive film 01 in the thickness direction of the main adhesive layer are defined as a first surface 11A and a second surface 116, respectively. The first surface 11A is used to be attached to the target object 02, and the second surface 11B is used for arranging the auxiliary adhesive layer 12 thereon. Thus, the influence of the thickness of the main adhesive layer 11 on the curling effect of the adhesive film 01 may be reduced. Accordingly, the adhesive film 01 may be better curled as a whole, and it is more advantageous to detach the adhesive film 01 from the target object 02.

On this basis, to further describe the adhesive film 01 provided in some embodiments of the present disclosure, another unfavorable situation in the film tearing process in the related art will be exemplarily described firstly.

During the manufacture of an organic light-emitting diode (OLED) display panel, it is often required to attach an adhesive film onto the surface of the display panel to protect the display panel or transfer the display panel to the next process. Prior to the subsequent process, the adhesive film attached onto the display panel is removed by combining UV viscosity reduction and mechanical tearing.

Here, before the adhesive film is attached, release films (also referred to as release protective films), i.e., conventional film materials each composed of three layers, i.e., a release film, an adhesive film and a release film, are further attached onto two sides of the adhesive film in the thickness direction, respectively. Thus, it is convenient for the preparation, storage and transportation of the adhesive film.

Figure 10:
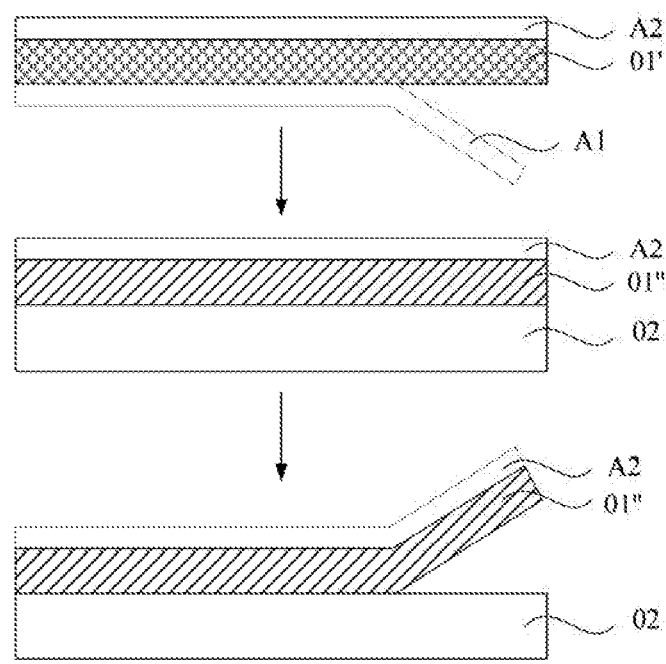
FIG. 10 is a schematic view of removing an adhesive film attached to a whole OLED display panel in the related art.

In addition, with reference to FIG. 10, the process of attaching the adhesive film onto the target object 02 (e.g., a display panel) will be described. The release film A1 on one side of the adhesive film 01' is removed, and the exposed surface of the adhesive film 01' is attached to the target object 02. With continued referring to FIG. 10, the process of removing the adhesive film from the target object 02 (e.g., a display panel) will be described. The viscosity of the adhesive film 01' is reduced by UV light to obtain an adhesive film 01" with reduced viscosity, and the adhesive film 01" with reduced viscosity and the release film A2 on the other side of the adhesive film 01" are detached as a whole (i.e., as a carrier film) by mechanical tearing.

However, in a case where the target object 02 is an OLED display panel, during the UV viscosity reduction (i.e., UV light irradiation) of the adhesive film 01', since UV light is high in energy, an electronic energy level transition is likely to occur in the light emitting material for each light emitting device in the OLED display device after the light emitting material is irradiated by UV light, resulting in the change in the turn-on voltage of the corresponding light emitting device. Thus, various problems are caused, such as instability of the light emitting device in low brightness and the presence of blue spots in the display region of the OLED display panel.

Table 1 below illustrates the change in the turn-on voltages of a red (R) light emitting device, a green (G) light emitting device and a blue (B) light emitting device after being irradiated by UV light with different energy densities. Thus, the turn-on voltage of the light emitting device of each color will change after the light emitting device is irradiated by UV light, so that the stability of the light emitting performance of each light emitting device is adversely affected.

TABLE 1

Turn-on voltage values of different light emitting devices after being irradiated by UV light

| UV energy (MJ) | 1250 | 2000 | 3000 | 4000 |
|---|---|---|---|---|
| Turn-on voltage of the R light emitting device (V) | 5.573 | 5.604 | 6.619 | 5.642 |
| Turn-on voltage of the G light emitting device (V) | 5.500 | 5.535 | 5.535 | 5.566 |
| Turn-on voltage of the B light emitting device (V) | 5.354 | 5.393 | 5.427 | 5.427 |

The "MJ" is the unit of the energy density of UV light, i.e., megajoule.

On this basis, some embodiments of the present disclosure provide an adhesive film. In this adhesive film, the plurality of deformable particles 20 dispersed in the adhesive film body 10 are made of temperature-responsive polymers. Correspondingly, the trigger condition is that the plurality of deformable particles 20 are heated and the temperature of the plurality of deformable particles 20 is controlled to be greater than the lower critical solution temperature of the temperature-responsive polymers. In this way, the problems of the display panel, resulted from UV viscosity reduction, in the related art may be effectively solved.

Here, the temperature-responsive polymers are high molecular polymers in which the conformation of molecular chains will change with the change in temperature. When the temperature of the temperature-responsive polymers reaches and exceeds a certain critical temperature, the conformation of molecular chains will change abruptly. The critical temperature that can lead to the abrupt change in the conformation of molecular chains in the temperature-responsive polymers is called a lower critical solution temperature (LCST).

After being cured, the temperature-responsive polymers can form nanoscale gel microspheres (having a particle size of 500 nm to 2 μm) that, as deformable particles 20, can be dispersed in the adhesive film body 10. The volume of the nanoscale gel microsphere is relatively large when the temperature is lower than the LCST, and will be greatly decreased when the temperature is higher than the LCST.

It is to be noted that the method for heating the deformable particles 20 will not be limited in some embodiments of the present disclosure. For example, it is possible to heat one side of the adhesive film 01 by using resistance wires or by using hot gas so that the temperature of the deformable particles 20 is higher than the LCST of the corresponding temperature-responsive polymers, without adversely affecting the display panel.

For example, the temperature-responsive polymers include at least one of poly(N-isopropylacrylamide) (abbreviated as PNIPAM) or poly(N,N-vinyl-epsilon-caprolactam) (abbreviated as PVCL).

By taking the temperature-responsive polymers being PNIPAM as an example, the volume shrinkage principle will be described below.

The structural formula of N-isopropylacrylamide (abbreviated as NIPAM) is:

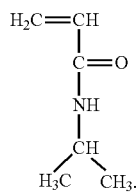

NIPAM is polymerized to obtain PNIPAM.
The structural formula of PNIPAM is:

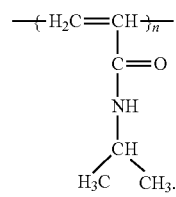

It can be known from above that a hydrophilic amido group (—CONH—) and a hydrophobic isopropyl group (—CH(CH3)2) are contained in the NIPAM molecules, that is, NIPAM is amphiphilic, i.e., hydrophilic and hydrophobic. Therefore, the PNIPAM obtained by polymerizing NIPAM is also amphiphilic.

Figure 11:
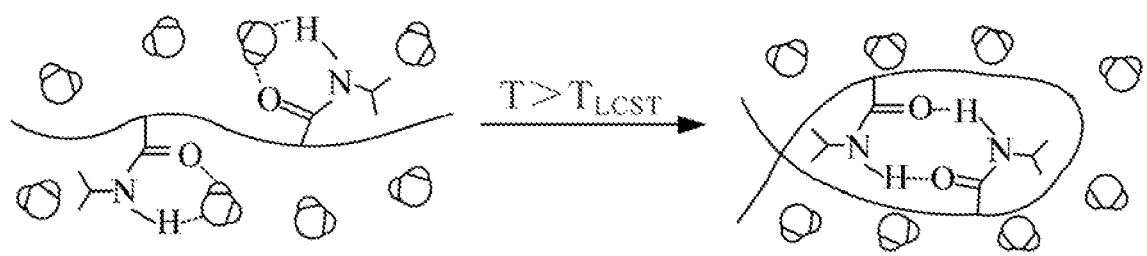
FIG. 11 is a schematic view of a change in molecular conformation of PNIPAM with a change in temperature.

FIG. 11 shows the change in the molecular conformation of PNIPAM with the change in temperature. The gel microspheres formed by curing PNIPAM are in a stretched hydrophilic state and is thus large in volume when their temperature is lower than the LCST. The gel microspheres formed by curing PNIPAM are in a shrunk hydrophobic state and will thus be greatly decreased in volume when their temperature is higher than the LCST. That is, the hydrophilicity/hydrophobicity of PNIPAM will correspondingly change with the change in its temperature.

Figure 12:
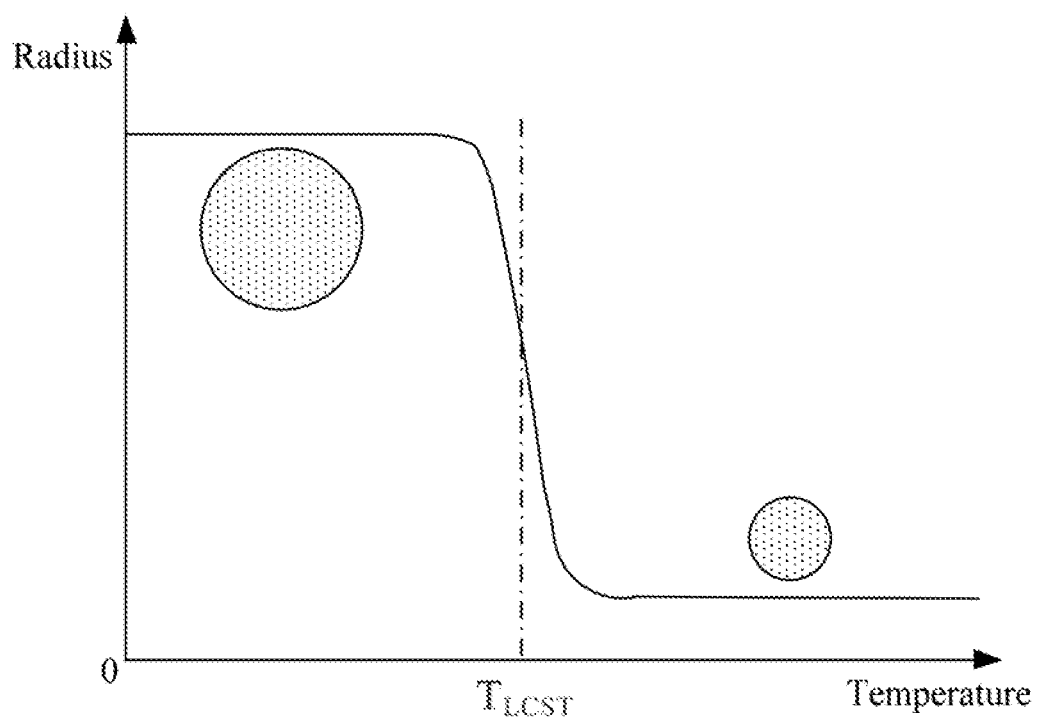
FIG. 12 is a schematic view of a change in the radius of gel microspheres formed by curing PNIPAM with a change in temperature.

For example, FIG. 12 shows the change in the radius of gel microspheres formed by curing PNIPAM with the change in temperature. It can be known that, when the temperature of the gel microspheres is higher than the corresponding LCST, the radius of the gel microspheres will be reduced significantly, that is, the volume will shrink obviously.

On this basis, by regulating the ratio of the hydrophilic groups to the hydrophobic groups in the NIPAM molecules, the LCST corresponding to the PNIPAM can be adjusted, so that the LCST of the PNIPAM can be set as 20° C. to 60° C. In this way, after the gel microspheres formed by curing PNIPAM are dispersed, as deformable particles 20, in the adhesive film body 10 to form the adhesive film 01, since the conventional ambient temperature at which the adhesive film 01 is attached to the target object 02 is usually the room temperature, i.e., lower than the LCST of PNIPAM, it can be ensured that the deformable particles 20 are in a stretched hydrophilic state and relatively large in volume before the deformable particles 20 are heated for stimulation.

Here, the temperature at which the adhesive film 01 is attached is usually the room temperature or slightly lower than the room temperature. The room temperature is also referred to as normal temperature or general temperature. Generally, the room temperature is defined within three ranges, i.e., (1) 23° C.±2° C., (2) 25° C.±5° C., and (3) 20° C.±5° C. Since the LCST of PNIPAM is generally about 32° C., when it is required to remove the adhesive film 01, the temperature of the deformable particles 20 in the adhesive film 01 can be higher than the corresponding LCST by slightly heating the adhesive film 01, without largely heating the adhesive film 01. Thus, the influence of the temperature on the target object 02 (e.g., a display panel) may be avoided, and it is more advantageous to remove the adhesive film.

In addition, in some embodiments where the temperature-responsive polymers are PVCL, when the gel microspheres formed by curing PVCL are used as deformable particles 20, the volume shrinkage principle will be described below. When the temperature of the gel microspheres is lower than the corresponding LCST, the gel microspheres will absorb water and swell. When the temperature of the gel microspheres is higher than the corresponding LCST, the gel microspheres will shrink in volume due to the polymer chain shrinkage resulted from water loss. After the gel microspheres formed by curing PVCL are dispersed, as deformable particles 20, in the adhesive film body 10 to form the adhesive film 01, the principle of the whole adhesive film 01 curling may refer to the description in the above some embodiments, and will not be repeated here.

Figure 13:
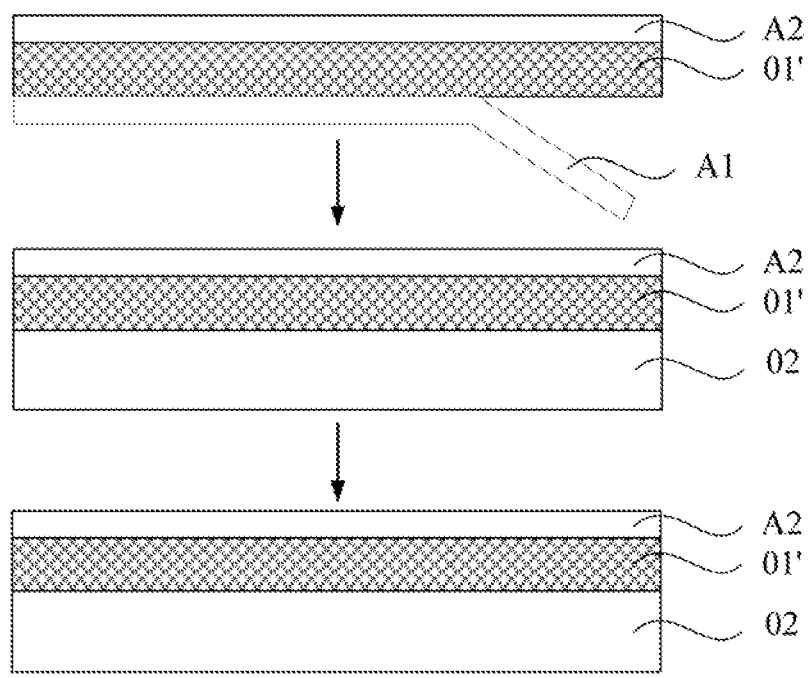
FIG. 13 is another schematic view of processing an adhesive film attached to a whole OLED display panel in the related art.

It will be added that, in the related art, as shown in FIG. 13, after the release film A1 on one side of the adhesive film 01' in the film layer is removed and the exposed surface of the adhesive film 01' is attached to the target object 02, if the adhesive film 01' is heated, the adhesive film 01' is still closely attached to the target object 02 as the temperature changes and cannot be detached from the target object 02.

However, when the adhesive film 01 including deformable particles 20 made of the temperature-adhesive polymers provided in some embodiments of the present disclosure is used, by heating the deformable particles 20 and controlling the temperature of the deformable particles 20 to be greater than the corresponding LCST, the adhesive film 01 can be curled, so that the adhesive film 01 may be easily detached from the target object 02.

In this way, in the adhesive film 01 provided in some embodiments of the present disclosure, by controlling the volume of the deformable particles 20 to change by temperature, the effective detachment of the adhesive film 01 from the target object 02 attached thereto may be easily and conveniently realized. Accordingly, a new adhesive film and a removal method thereof, which do not influence the characteristics of the light emitting material, can be provided for the OLED display panel.

Considering that the method for removing an adhesive film by UV viscosity reduction in the related art may adversely affect the light emitting devices in the OLED display panel, some other embodiments of the present disclosure provide an adhesive film. In the adhesive film, the plurality of deformable particles 20 dispersed in the adhesive film body 10 are made of Potential of Hydroge (i.e., pH)-responsive polymers. The pH-responsive polymers are sensitive to the change in the pH value. Correspondingly, the trigger condition is that the pH value of the adhesive film 10 in which the plurality of deformable particles 20 are dispersed (i.e., an environment where the deformable particles 20 are located) is changed. For example, the adhesive film 01 is soaked in corresponding acidic or basic liquid, so that the molecular chains in the pH-responsive polymers forming the deformable particles 20 shrink. In this way, the volume of the deformable particles 20 shrinks.

The change in the pH value of the environment where the deformable particles 20 are contained is related to parameters such as the type and/or specific structure of the pH-responsive polymers forming the deformable particles 20, and it will not be limited in the embodiments of the present disclosure.

In some examples, since the NIPAM is also responsive to the change in pH, the pH-responsive polymers may be PNIPAM, so that the volume of the deformable particles 20 shrinks by changing the pH value of the environment where the deformable particles 20 made of PNIPAM are contained. The volume shrinkage principle of the deformable particles 20 refers to the above description and will not be repeated here.

In addition, according to different materials forming the deformable particles 20, the materials of the auxiliary adhesive layer 12 in the adhesive film 01 may be different correspondingly.

In some embodiments of the present disclosure, the materials of the auxiliary adhesive layer 12 includes at least one of polydopamine, acrylic adhesive or epoxy resin adhesive. In this way, when the deformable particles 20 made of temperature-responsive polymers are dispersed in the auxiliary adhesive layer 12, the auxiliary adhesive layer 12 may be used as a temperature-sensitive film layer (i.e., sensitive to the change in temperature).

For example, the material of the auxiliary adhesive layer 12 is polydopamine (abbreviated as PDA), so that the auxiliary adhesive layer 12 may have better adhesion property. PDA is generally obtained by polymerizing dopamine (abbreviated as DA).

DA is a kind of catecholamine biological nerve conduction substance, with a molecular formula of C6H3(OH)2-CH2-CH2-NH2 and a following structural formula:

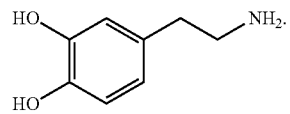

Molecules in DA can undergo rapid oxidation-self-polymerization in an aqueous solution of a weak base. Moreover, like the adhesion of mussels to the surface of an object, DA can form a polydopamine (PDA) nano-coating with high adhesion on the surface of almost all organic or inorganic materials.

By taking the deformable particles 20 being gel microspheres formed by PNIPAM and the material of the main adhesive layer 11 being an optically clear adhesive (OCA) as an example, the mechanical of fixing the deformable particles 20 on the surface of the OCA by DA will be specifically described below.

Figure 14:
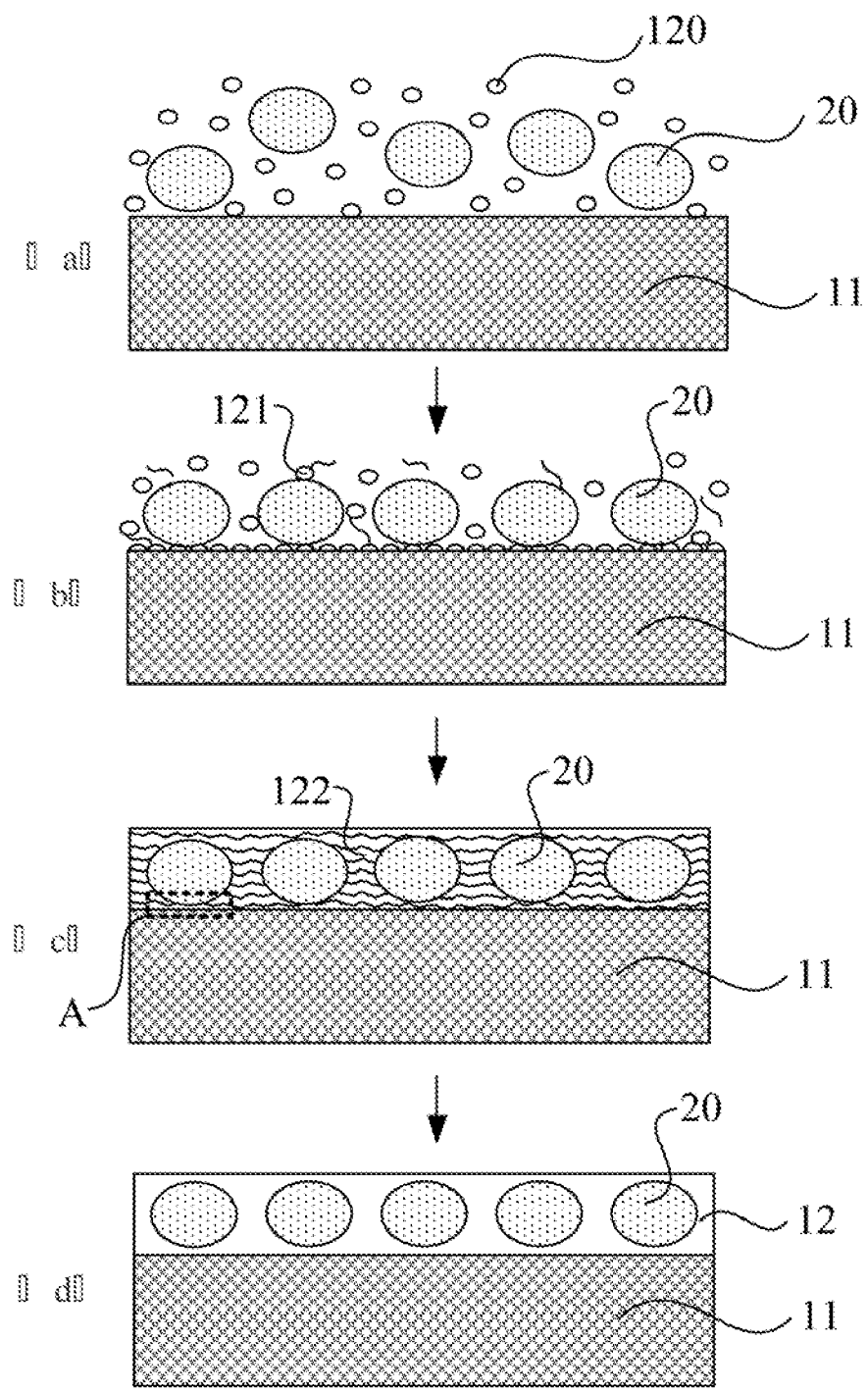
FIG. 14 is a schematic view of the mechanism of fixing PNIPAM gel microspheres on a surface of an OCA by DA, in an adhesive film, in accordance with some embodiments of the present disclosure.

Firstly, as shown in (a) of FIG. 14, a DA solution with adhesion property is coated on the surface of the main adhesive layer 11 (OCA), and the deformable particles 20 (gel microspheres formed by PNIPAM) are dispersed in the solution.

Figure 15:
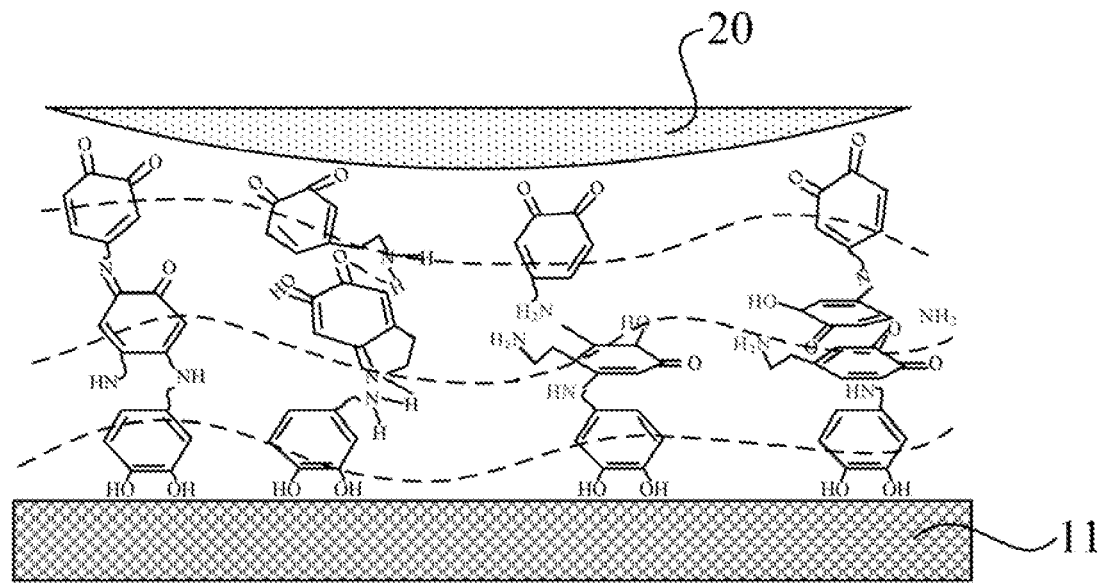
FIG. 15 is an enlarged view of an A region in the adhesive film of FIG. 14.

Secondly, as shown in (b), (c) and (d) of FIG. 14, under a weak base condition, DA molecules 120 in the DA solution undergo oxidation-self-polymerization to form DA oligomers 121 and then form PDA 122, and the PDA 122 is finally cured to form the auxiliary adhesive layer 12 (PDA layer), so that the deformable particles 20 are fixed on the surface of the main adhesive layer 11. The fixed connection between the deformable particles 20 and the main adhesive layer 11 is shown in FIG. 15.

In this way, when the temperature of the deformable particles 20 is higher than the LCST of PNIPAM, the volume of the deformable particles 20 will shrink greatly, so that molecular chains of PDA in the auxiliary adhesive layer 12 configured to fix the deformable particles 20 are drawn and dragged. Thus, an inward shrinkage stress is generated in the PDA layer (i.e., the auxiliary adhesive layer 12), and the PDA layer is curled. Since the deformable particles 20 are fixed on the surface of the main adhesive layer 11 by the PDA layer, when the PDA layer is curled, the OCA layer (i.e., main adhesive layer 11) in contact with the PDA layer can be curled quickly and significantly, so that it is more advantageous to detach the adhesive film 01 from the target object 02 attached thereto.

Figure 16:
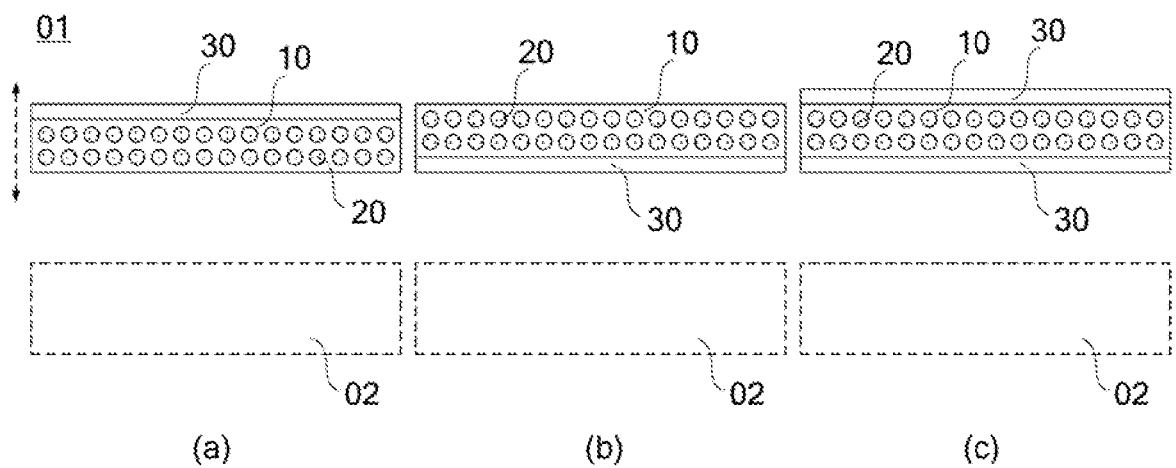
FIG. 16 is a schematic sectional view of yet another adhesive film in its thickness direction, in accordance with some embodiments of the present disclosure.

In some embodiments of the present disclosure, as shown in FIG. 16, the adhesive film 01 further includes a protective film 30 located on at least one of two sides of the adhesive film body 10 in the thickness direction of the adhesive film body 10 (indicated by the dashed double-headed arrow in FIG. 16) to facilitate the preparation, storage and transportation of the adhesive film 01. Optionally, the protective film 30 is a release film.

For example, (a), (b) and (c) in FIG. 16 illustratively show three different structures of the adhesive film 01. The adhesive film shown in (a) of FIG. 16 is of a structure in which the protective film 30 is located on a side of the adhesive film body 10 away from the target object 02, the adhesive film shown in (b) of FIG. 16 is of a structure in which the protective film 30 is located on a side of the adhesive film 10 proximate to the target object 02, and the adhesive film shown in (c) of FIG. 16 is of a structure in which two protective films 30 are respectively located on two sides of the adhesive film body 10 in the thickness direction of the adhesive film body.

It may be understood that, by taking the adhesive films 01 shown in (b) and (c) of FIG. 16 as an example, that is, when a protective film 30 is arranged on a side of the adhesive film body 10 configured to be attached onto the target object 02 (illustrated by the dashed box in FIG. 16), in the process of attaching the adhesive film 01 to the target object 02, the protective film 30 on this side is removed firstly to expose the adhesive film body 10.

By taking the adhesive films 01 shown in (a) and (c) of FIG. 16 as an example, that is, when a protective film 30 is arranged on a side of the adhesive film body 10 away from the target object 02, the protective film 30 on this side is reserved to facilitate the attaching operation and the adhesive film removal operation after attaching. Moreover, since the protective film 30 merely functions to protect the surface of the adhesive film body 10, the protective film 30 is generally thin. Therefore, when the adhesive film 10 is curled, the protective film 30 attached to the adhesive film can also be curled.

Figure 17:
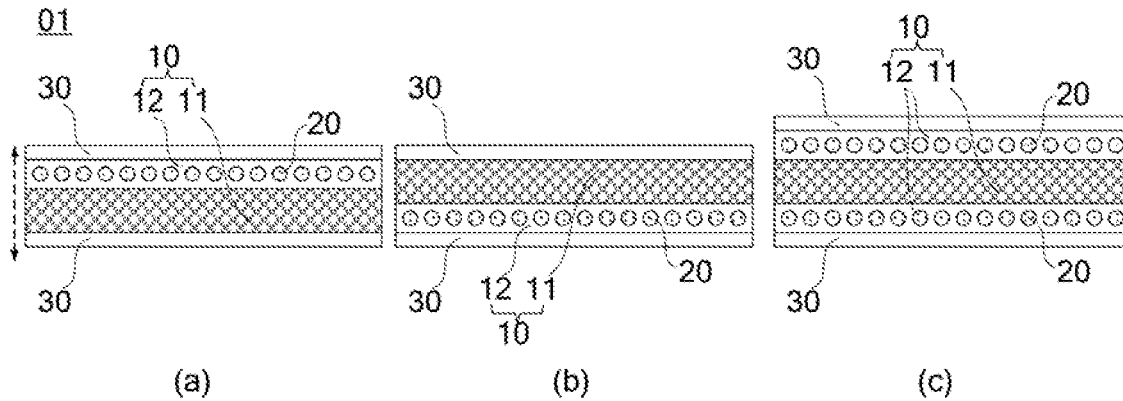
FIG. 17 is a schematic sectional view of yet another adhesive film in its thickness direction, in accordance with some embodiments of the present disclosure.

In still other examples, with reference to FIG. 17, the adhesive film body 10 includes a main adhesive layer 11 and an auxiliary adhesive layer 12 disposed on at least one of two sides of the main adhesive layer 11 in the thickness direction of the main adhesive layer. The deformable particles 20 are dispersed in the auxiliary adhesive layer 12. The arrangement of the protective film 30 on the adhesive film body 10 may be selectively set according to actual needs. For example, protective films 30 are arranged on two sides of the adhesive film body 10 in the thickness direction of the adhesive film body, respectively. The arrangement of the protective films 30 is as shown in FIG. 17. That is, it is possible that, as shown in (a) and (b) of FIG. 17, the protective film 30 on one side is attached onto the main adhesive film 11 and the protective film 30 on the other side is attached onto the auxiliary adhesive film 12. It is also possible that, as shown in (c) of FIG. 17, the protective films 20 on two sides are attached onto the corresponding auxiliary adhesive layers 12 on two sides, respectively.

The attaching process and the removal process of the adhesive film 01 may refer to the relevant description in the above some embodiments, and will not be repeated here.

Figure 18:
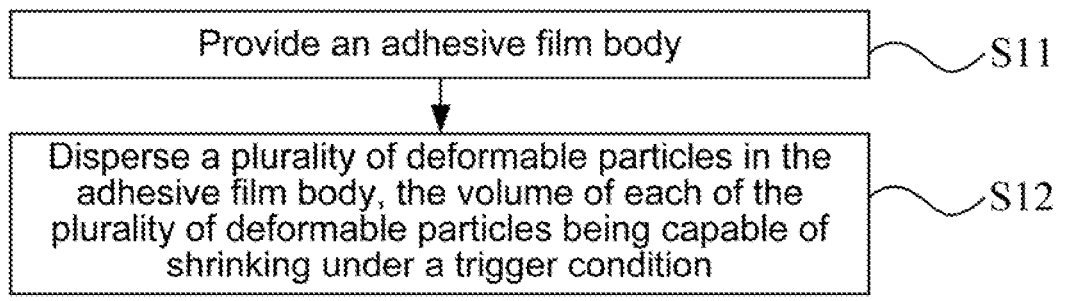
FIG. 18 is a schematic flowchart of a method of preparing an adhesive film, in according with some embodiments of the present disclosure.

Some embodiments of the present disclosure further provide a method for preparing an adhesive film, which is used for preparing the adhesive film described in the above some embodiments. As shown in FIG. 18, the method for preparing an adhesive film includes S11 and S12.

In S11, an adhesive film body is provided.

The adhesive film body is made of adhesive material(s) satisfying the corresponding requirements on viscosity.

In S12, a plurality of deformable particles are dispersed in the adhesive film body, the volume of each of the plurality of deformable particles being capable of shrinking under a trigger condition.

The beneficial effects that can be achieved by the method for preparing the adhesive film are the same as the beneficial effects that can be achieved by the adhesive film provided in some embodiments of the present disclosure, and will not be repeated here.

Figure 19:
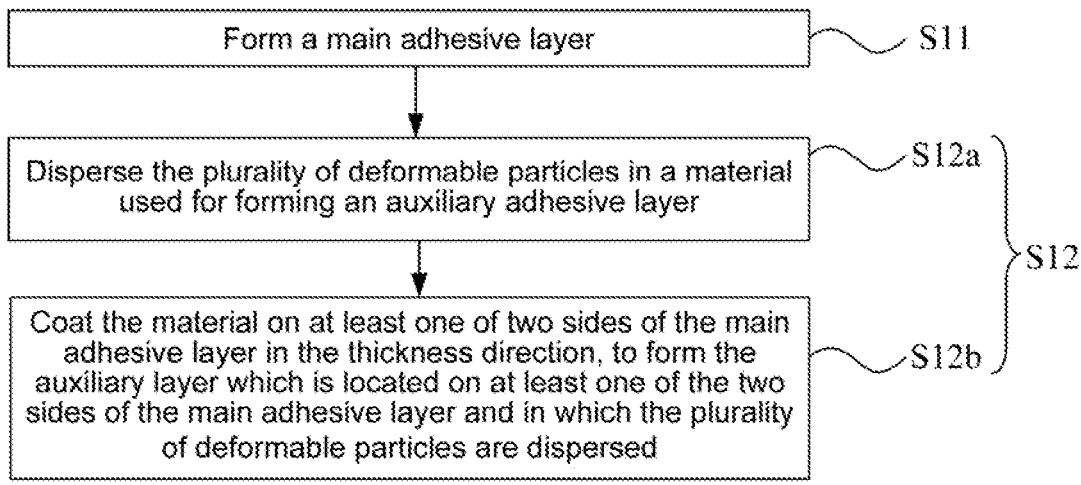
FIG. 19 is a schematic flowchart of another method of manufacturing an adhesive film, in accordance with some embodiments of the present disclosure.

In some embodiments, with reference to FIGS. 4-9 and FIG. 17, in a case where the adhesive film body 10 includes a main adhesive layer 11 and an auxiliary adhesive layer 12, as shown in FIG. 19, S11 includes: forming the main adhesive layer 11. S12 includes S12a and S12b.

In S12a, the plurality of deformable particles 20 are dispersed in material(s) used for forming the auxiliary adhesive layer 12.

In S12b, the material(s) is coated on at least one of two sides of the main adhesive layer 11 in the thickness direction of the main adhesive layer to form the auxiliary adhesive layer 12 which is located on at least one of the two sides of the main adhesive layer 11 and in which the plurality of deformable particles 20 are dispersed.

For example, the deformable particles 20 are PNIPAM gel microspheres; the material used for forming the auxiliary adhesive layer 12 is a weak base solution of DA; and the S12b of dispersing the plurality of deformable particles 20 in the material used for forming the auxiliary adhesive layer 12 includes: dispersing a plurality of PNIPAM gel microspheres in the weak base solution of DA.

Figure 20:
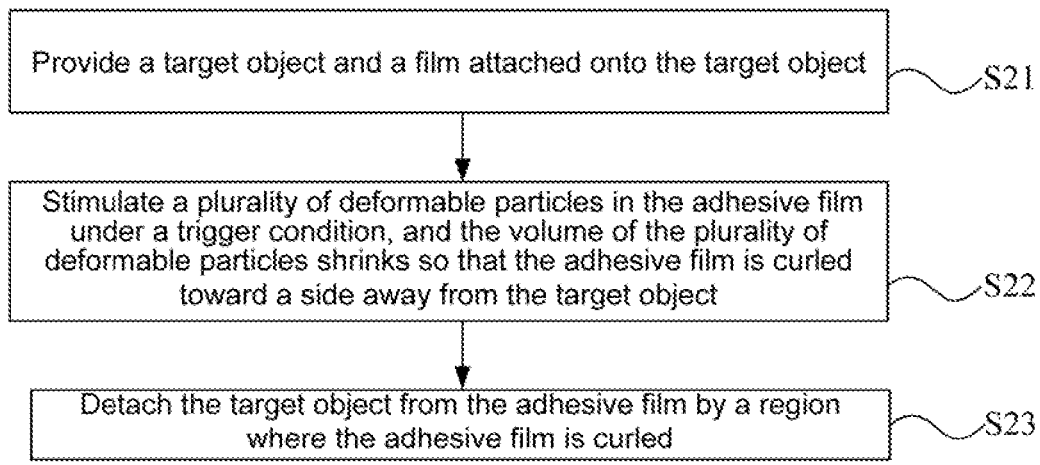
FIG. 20 is a schematic flowchart of a method of removing an adhesive film, in accordance with some embodiments of the present disclosure.

Some embodiments of the present disclosure further provide a method for removing an adhesive film, which is used for removing the adhesive film described in the above some embodiments. As shown in FIG. 20, the method for removing the adhesive film includes S21 to S23.

In S21, a target object and the adhesive film according to any one of the above embodiments attached onto the target object are provided.

In S22, a plurality of deformable particles in the adhesive film are stimulated under a trigger condition. The volume of the plurality of deformable particles shrinks so that the adhesive film is curled toward a side away from the target object.

In S23, the target object is detached from the adhesive film by a region where the adhesive film is curled.

After the adhesive film is curled, the target object may be detached from the adhesive film by simple mechanical tearing, so that the removal difficulty of the adhesive film may be reduced and the adhesive film residue may be avoided.

The beneficial effects that may be achieved by the method for removing an adhesive film are the same as the beneficial effects that may be achieved by the adhesive film provided in some embodiments of the present disclosure, and will not be repeated here.

It may be understood that, with reference to FIGS. 16 and 17, in a case where the adhesive film 01 further includes a protective film 30 located on at least one of two sides of the adhesive film body 10 in the thickness direction of the adhesive film body, if the protective film 30 is located on a side of the adhesive film body 10 configured to be attached to the target object 02, the protective film 30 on this side is removed to expose the adhesive film body 10 when the adhesive film 01 is attached to the target object 02. If the protective film 30 is located on a side of the adhesive film body 10 away from the target object 02, the protective film 30 on this side is reserved. To facilitate the attaching operation and the removal operation after attaching, the protective film 30 on this side may be reserved.

For example, the target object 02 is a display panel.

In some embodiments, the display panel is an OLED display panel, and the deformable particles 20 in the adhesive film 01 are made of temperature-responsive polymers. In this way, the problem of adversely affecting light emitting devices in the OLED display panel during the removal of the adhesive film by UV viscosity reduction in the related art may be effectively solved.

When the deformable particles 20 in the adhesive film 01 are made of temperature-responsive polymers, the S22 correspondingly includes: heating the plurality of deformable particles 20, and controlling the temperature of the plurality of deformable particles 20 to be greater than the lower critical solution temperature of the temperature-responsive polymers. In this way, the volume of the deformable particles 20 can shrink, and the adhesive film 01 is curled toward a side away from the target object 02.

Here, the temperature at which the plurality of deformable particles 20 are heated is generally greater than the lower critical solution temperature of the temperature-responsive polymers. In addition, the specific type of the temperature-responsive polymers and the principle for volume shrinkage of the deformable particles 20 when the temperature is greater than the corresponding LCST refer to the above description, and will not be repeated here.

In some other embodiments, the display panel is an OLED display panel, and the deformable particles 20 in the adhesive film 01 are made of pH-responsive polymers. In this way, the problem of adversely affecting light emitting devices in the OLED display panel during the removal of the adhesive film by UV viscosity reduction in the related art may also be effectively solved.

The S22 correspondingly includes: changing the pH value of the adhesive film in which the plurality of deformable particles 20 are dispersed. For example, the adhesive film 01 is soaked in corresponding acidic or basic liquid, so that the volume of the deformable particles 20 shrinks and the adhesive film 01 is curled toward a side away from the target object 02.

In addition, the specific type of the pH-responsive polymers and the principle for corresponding volume shrinkage of the deformable particles 20 refer to the above description, and will not be repeated here.

Figure 21:
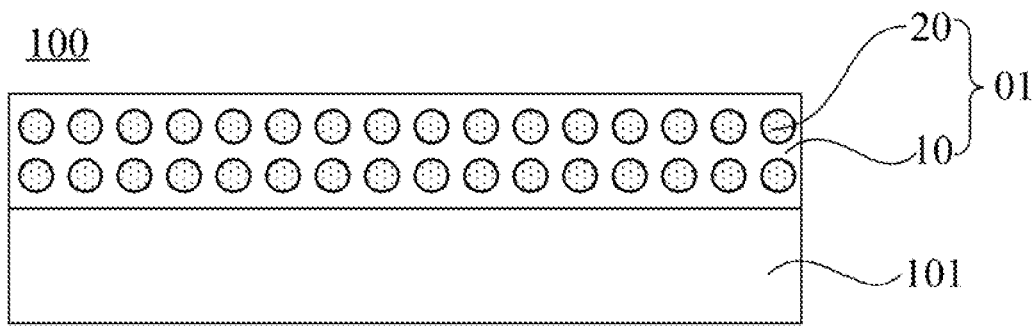
FIG. 21 is a schematic structural diagram of a display device, in accordance with some embodiments of the present disclosure.

Some embodiments of the present disclosure further provide a display device. As shown in FIG. 21, the display device 100 includes a display product, and the adhesive film 01 according to any one of the above embodiments. The adhesive film body 10 in the adhesive film 01 is attached onto the display product 101.

The display product 101 includes, but is not limited to, the following structures: for example, a manufactured display panel or display substrate, an intermediate product in the manufacturing process, a related structural part used for fabricating a display panel or a display substrate, etc. The display product 101 is any related structure that requires the adhesive film 01 to protect and/or transfer it.

When it is necessary to remove the adhesive film 01 attached to the display product 101, the beneficial effects that may be achieved by the display device 100 are the same as the beneficial effects that may be achieved by the adhesive film provided in some embodiments of the present disclosure, and will not be repeated here.

Exemplarily, the display product 101 is an OLED display panel. In this way, when the deformable particles 20 in the adhesive film 01 attached onto the OLED display panel are made of temperature-responsive polymers, by changing the volume of the deformable particles 20 by temperature control, the effective detachment of the adhesive film 01 from the display product 101 attached thereto may be easily and conveniently realized. Accordingly, a new adhesive film and a removal method thereof, which do not influence the characteristics of the light emitting material, can be provided for OLED display panels.

In some embodiments of the present disclosure, the display device 100 may be any device that displays moving images (e.g., videos), stationary images (e.g., static images), texts or pictures. More specifically, it is contemplated that the embodiments may be implemented in or associated with various electronic devices. The various electronic devices include, but are not limited to, mobile phones, wireless devices, portable android devices (PADs), handheld or portable computers, global positioning system (GPS) receivers/navigators, cameras, MPEG-4 Part 14 (MP4) video players, video cameras, game consoles, watches, clocks, calculators, TV monitors, flat panel displays, computer monitors, vehicle displays (e.g., odometer displays, etc.), navigators, cabin controllers and/or displays, camera view displays (e.g., displays for rear cameras in vehicles), electronic photos, electronic billboards or indicators, projectors, building structures, packaging and aesthetic structures (e.g., displays for displaying images of a piece of jewelry), etc.

In the description of the above implementations, the specific features, structures, materials or characteristics can be combined in a proper manner in any one or more embodiments or examples.

The foregoing description merely shows the specific implementations of the present disclosure, and the protection scope of the present disclosure is not limited thereto. Any person of skill in the art can readily conceive of variations or replacements without departing from the technical scope of the present disclosure, and these variations or replacements shall fall into the protection scope of the present disclosure. Therefore, the protection scope of the present disclosure shall be subject to the protection scope of the appended claims.

What is claimed is:
1. An adhesive film, comprising:
   an adhesive film body; and
   a plurality of deformable particles, a volume of each of the plurality of deformable particles being capable of shrinking under a trigger condition, wherein the adhesive film body includes:
a main adhesive layer; and
at least one auxiliary adhesive layer disposed on at least one side of two sides of the main adhesive layer in a thickness direction of the main adhesive layer,
the plurality of deformable particles are dispersed in the at least one auxiliary adhesive layer, and
materials of the plurality of deformable particles include temperature-responsive polymers or pH-responsive polymers.

2. The adhesive film according to claim 1, wherein the temperature-responsive polymers include at least one of poly(N-isopropylacrylamide) or poly(N,N-vinyl-epsilon-caprolactam).

3. The adhesive film according to claim 1, wherein the at least one auxiliary adhesive layer includes one auxiliary adhesive layer located on one of the two sides of the main adhesive layer in the thickness direction of the main adhesive layer; and
any side of the two sides of the main adhesive layer is configured to be attached to a target object.

4. The adhesive film according to claim 1, wherein materials of the at least one auxiliary adhesive layer include at least one of polydopamine, acrylic adhesive or epoxy resin adhesive.

5. The adhesive film according to claim 1, further comprising at least one protective film located on at least one side of two sides of the adhesive film body in a thickness direction of the adhesive film body.

6. The adhesive film according to claim 1, wherein the at least one auxiliary adhesive layer includes two auxiliary adhesive layers located on the two sides of the main adhesive layer in the thickness direction of the main adhesive layer, respectively.

7. The adhesive film according to claim 5, wherein the at least one protective film includes two protective films located on the two sides of the adhesive film body in the thickness direction of the adhesive film body, respectively.

8. A method for preparing the adhesive film according to claim 1, the method comprising:
providing the adhesive film body; and
dispersing the plurality of deformable particles in at least a part of the adhesive film body, the volume of each of the plurality of deformable particles being capable of shrink under a trigger condition, wherein
providing the adhesive film body includes:
forming a main adhesive layer; and
dispersing the plurality of deformable particles in at least a part of the adhesive film body includes:
dispersing the plurality of deformable particles in materials used for forming at least one auxiliary adhesive layer, and
coating obtained materials on at least one of two sides of the main adhesive layer in a thickness direction of the main adhesive layer to form the at least one auxiliary adhesive layer which is located on at least one of the two sides of the main adhesive layer and in which the plurality of deformable particles are dispersed.

9. A display device, comprising:
a display product; and
the adhesive film according to claim 1 attached to the display product.

10. The display device according to claim 9, wherein the display product is an organic light-emitting diode (OLED) display panel.

11. A method for removing an adhesive film, comprising:
providing a target object and the adhesive film according to claim 1 attached to the target object;
the plurality of deformable particles in the adhesive film under the trigger condition, so that the volume of each of the plurality of deformable particles shrinks to curl the adhesive film toward a side away from the target object; and
detaching the target object from the adhesive film through a region where the adhesive film is curled,
wherein in a case where the materials of the plurality of deformable particles are temperature-responsive polymers;
stimulating the plurality of deformable particles in the adhesive film under the trigger condition includes;
heating the plurality of deformable particles; and
controlling a temperature of the plurality of deformable particles to be greater than a lower critical solution temperature of the temperature-responsive polymers,
wherein in a case where the materials of the plurality of deformable particles are pH-responsive polymers,
stimulating the plurality of deformable particles in the adhesive film under the trigger condition includes:
changing a pH value of the adhesive film in which the plurality of deformable particles are dispersed.

12. The method for removing the adhesive film according to claim 11, wherein the target object is a display panel.

* * * * *